United States Patent
Rosenthal et al.

(10) Patent No.: US 10,595,423 B2
(45) Date of Patent: Mar. 17, 2020

(54) ELECTRONICS HOUSING FOR ELECTRONICS IN A MOTOR VEHICLE

(71) Applicant: BROSE FAHRZEUGTEILE GMBH & CO. KOMMANDITGESELLSCHAFT, BAMBERG, Bamberg (DE)

(72) Inventors: Karl-Heinz Rosenthal, Baunach (DE); Matthias Markert, Hassfurt (DE)

(73) Assignee: Brose Fahrzeugteile GmbH & Co. Kommanditgesellschaft, Bamberg, Bamberg (DE)

( * ) Notice: Subject to any disclaimer, the term of this patent is extended or adjusted under 35 U.S.C. 154(b) by 0 days.

(21) Appl. No.: 15/933,658

(22) Filed: Mar. 23, 2018

(65) Prior Publication Data

US 2018/0213666 A1 Jul. 26, 2018

Related U.S. Application Data

(63) Continuation of application No. PCT/EP2016/072634, filed on Sep. 23, 2016.

(30) Foreign Application Priority Data

Sep. 23, 2015 (DE) .......................... 10 2015 218 270

(51) Int. Cl.
*H05K 5/06* (2006.01)
*H05K 5/00* (2006.01)
(Continued)

(52) U.S. Cl.
CPC .................. *H05K 5/06* (2013.01); *B60L 1/14* (2013.01); *B60Q 1/24* (2013.01); *H05K 5/0052* (2013.01);
(Continued)

(58) Field of Classification Search
CPC ...... B60L 1/14; H05K 5/0052; H05K 5/0213; H05K 5/06; H05K 9/0007; B60Q 1/24
See application file for complete search history.

(56) References Cited

U.S. PATENT DOCUMENTS 5,574,254 A * 11/1996 Mori ...................... H02G 3/088
174/561
6,706,984 B1 * 3/2004 Turner ..................... F16C 1/12
200/331
(Continued)

FOREIGN PATENT DOCUMENTS

CN 101742849 A 6/2010
DE 112013001167 T5 11/2014
(Continued)

*Primary Examiner* — Jinhee J Lee
*Assistant Examiner* — Ingrid D Wright
(74) *Attorney, Agent, or Firm* — Laurence A. Greenberg; Werner H. Stemer; Ralph E. Locher

(57) ABSTRACT

An electronics housing is specified for electronics in a motor vehicle. The electronics housing has a first housing shell with a first base plate and a first side wall as well as a second housing shell with a second base plate and a second side wall. The first side wall is embodied here with double walls either completely or at least in one section, with the result that a groove-shaped wall intermediate space is formed between an outer partial wall and an inner partial wall of the first side wall. In an assembled state of the housing, the second side wall dips into this wall intermediate space.

17 Claims, 12 Drawing Sheets

(51) Int. Cl.
 *B60L 1/14* (2006.01)
 *B60Q 1/24* (2006.01)
 *H05K 5/02* (2006.01)
 *H05K 9/00* (2006.01)

(52) U.S. Cl.
 CPC ......... *H05K 5/0213* (2013.01); *H05K 9/0007* (2013.01)

(56) References Cited

U.S. PATENT DOCUMENTS

| | | | |
|---|---|---|---|
| 6,727,806 B1 * | 4/2004 | Massie | B60R 25/1001 116/28 R |
| 8,210,378 B2 * | 7/2012 | Takeuchi | H02G 3/14 174/50.5 |
| 9,391,437 B2 | 7/2016 | Shimizu et al. | |
| 9,521,772 B2 * | 12/2016 | Etlinger | H05K 5/061 |
| 9,819,168 B2 * | 11/2017 | Shiraki | H02G 3/14 |
| 2006/0021779 A1 | 2/2006 | Kanazawa | |
| 2013/0032371 A1 * | 2/2013 | Makino | H02G 3/088 174/50 |

FOREIGN PATENT DOCUMENTS

| | | |
|---|---|---|
| JP | 2006074988 A | 3/2006 |
| JP | 2009099677 A | 5/2009 |

* cited by examiner

ELECTRONICS HOUSING FOR ELECTRONICS IN A MOTOR VEHICLE

CROSS-REFERENCE TO RELATED APPLICATION

This application is a continuation, under 35 U.S.C. § 120, of copending international application No. PCT/EP2016/072634, filed Sep. 23, 2016, which designated the United States; this application also claims the priority, under 35 U.S.C. § 119, of German patent application No. DE 10 2015 218 270.3, filed Sep. 23, 2015; the prior applications are herewith incorporated by reference in their entireties.

BACKGROUND OF THE INVENTION

Field of the Invention

The invention relates to an electronics housing for electronics in a motor vehicle. The invention further relates to an electronic control device (in particular tailgate control device) for a motor vehicle that comprises this electronics housing.

Modern motor vehicles are regularly equipped with a plurality of electronic control devices. A typical example of such a control device is a tailgate control device, that is to say a motor control device for a motor-adjustable tailgate of the motor vehicle.

Such a control device normally contains an electronics housing in which the electronics of the control device is received. The electronics typically contains a printed circuit board which is populated with electronic components, in particular a microcontroller. The electronics housing serves, inter alia, to protect the electronics against penetrating water. As a rule, the housing is intended here to offer protection against dripping water.

Furthermore, the electronics housing is regularly intended to offer effective ESD protection, that is to say to protect the electronics received therein against damage by electrostatic electrostatic discharge (ESD for short).

A conventional electronics housing is formed as a rule from two housing shells which are connected to one another in a form-fitting manner by a latching connection (clip connection). Here, the side walls of the two housing shells are usually positioned on one another with a slight overlap along a complementary stacked contour on the edge of the two side walls. However, such an electronics housing offers sufficient protection only against dripping water which vertically impinges the housing shell which overlaps on the outer side. For optimum dripping water protection, such an electronics housing must thus always be mounted in such a way that the housing shell which overlaps on the outer side points upward, and thus in such a way that the separation between the housing shells lies in a horizontal plane. However, such an installation situation cannot be regularly guaranteed, precisely in view of the confined installation space in a motor vehicle. Rather, electronics housings must here frequently be mounted obliquely or on edge, with the result that the separation between the housing shells lies in an oblique or vertical plane. In this case, it may occur that liquid, in particular dripping water, seeps between the housing shells into the housing interior and leads there to corrosion of the electronics or even to an electrical short circuit.

A conventional electronics housing furthermore often offers only a limited ESD protection.

SUMMARY OF THE INVENTION

The object on which the invention is based is to specify an electronics housing for a motor vehicle that protects electronics received therein in a particularly reliable manner, in particular against penetrating liquid (for example dripping water) and/or ESD.

With respect to an electronics housing, this object is achieved according to the invention by the features of the first independent claim. With respect to a control device (in particular tailgate control device) for a motor vehicle, the object is achieved according to the invention by the features of the second independent claim. Design forms and developments of the invention which are advantageous and in some cases inventive in themselves are set forth in the subclaims and the following description.

The (electronics) housing according to the invention serves for receiving electronics, i.e. in particular for receiving a printed circuit board which is populated with electronic components and which is intended for use in a motor vehicle. The electronics hosing contains a first housing shell and a second hosing shell. The first housing shell contains a base plate and a peripheral side wall projecting therefrom. The second housing shell likewise contains a base plate and a peripheral side wall projecting therefrom. The term "peripheral side wall" is understood to mean that each of the two side walls surrounds the associated base surface as an at least substantially closed frame. However, within the scope of the invention, each of the two side walls can here have one or more cutouts, slots or other openings which serve, for example, as leadthroughs for cables or operating elements (for example switches, light indicators, etc.) or are required for production or functional reasons. Each housing shell is thus of trough-shaped design, with the result that each housing shell forms a hollow body which is open to one side and delimits an interior. Here, the side walls of the two housing shells can be assembled or are assembled (in the mounted state), with the result that the housing shells combine to form the housing which—apart from any present leadthroughs or contact openings—is closed. For this purpose, the two side walls have a uniform contour in cross section.

In order to draw a terminological distinction, the base plate of the first housing shell is also designated herein below as "first base plate", and the side wall of the first housing shell is also designated as "first side wall". Correspondingly, the base plate of the second housing shell is also designated herein below as "second base plate" and the side wall of the second housing shell is also designated as "second side wall".

Here, according to the invention, the first side wall, that is to say the side wall of the first housing shell, is designed to be double-walled completely or at least in one portion. The first side wall is thus formed by two partial walls which are spaced apart from one another, namely an inner partial wall and an outer partial wall, with the result that a groove-like wall interspace is formed between the two partial walls which are spaced apart from one another. Here, in an advantageous embodiment, the first side wall is designed to be double-walled over a predominant fraction (that is to say more than 50%) of its height—measured transversely to the first base plate. Preferably, the first side wall is designed to be double-walled to a large part (for example more than 75%, or more than 80%) of its height or even over its entire height.

The two housing shells are assembled according to the invention in such a way that, in the assembled state of the housing, the second side wall engages in the wall interspace of the first side wall. The two side walls thus overlap in a region (designated herein below as "overlapping region") according to a tongue and groove principle, with the two partial walls of the first side wall engaging around the second side wall.

By virtue of the fact that the two housing shells are plugged one inside the other as described above, a labyrinth-like connecting point of the two housing shells is created by which the housing is protected in a particularly simple but at the same time effective manner against penetrating liquid, in particular dripping water, but also against electrostatic discharge. In addition, a wall thickness which is increased by comparison with conventional electronics housings results in the assembled housing through the overlapping of the two side walls in the overlapping region, whereby the assembled housing obtains an increased degree of stability. In addition, openings which must be present in the wall for functional reasons or tool-related reasons can be covered by a nesting arrangement of the side walls and thus closed tightly.

To further improve the protective effect of the housing against penetrating liquid, in particular dripping water, in a preferred embodiment of the housing at least one of the two housing shells is provided with means for liquid channeling which serve to drain liquid impinging the housing in a defined manner.

Thus, in a preferred embodiment of the invention, the first housing shell is breached by at least one outflow opening in a groove base by which the two partial walls of the first side wall are connected. Here, the or each outflow opening is guided to the outer side of the electronics housing. Liquid which possibly seeps between the side walls, which are plugged one inside the other, of the first and second housing shell into the wall interspace of the first side wall is thus caused to flow off through the or each outflow opening to the housing outer side. Liquid is thereby prevented in turn from accumulating in the wall inter space.

At its housing outer-type mouth, the or each outflow opening is preferably surrounded—roughly in the manner of a parapet—by a peripheral web. By virtue of this web, the or each outflow opening does not open flush in the outer-side surface of the first housing shell. Rather, the housing outer-side mouth of the or each outflow opening is elevated with respect to the surrounding surface of the first housing shell by virtue of the parapet-like web, that is to say projects beyond the surrounding surface of the first housing shell. This ensures that liquid cannot flow from the surface of the first housing shell—in the opposite direction to the intended liquid channeling—into the outflow opening. Rather, such liquid is channeled in a targeted manner by the web around the assigned outflow opening.

In addition or alternatively, a web is arranged on the second housing shell on the housing outer side, which web is elevated with respect to a surrounding surface of the second housing shell and extends around an edge of the second base plate—again in the manner of a parapet. This web prevents liquid from flowing off in an uncontrolled manner over the edge of the second base plate and the adjoining side wall. Rather, the web allows liquid accumulated on the second base plate to flow off only at one or more predetermined points. For this purpose, the web is provided at the or each of these points with a drain—for example in the form of an interruption of the web—which leads to the edge of the second base plate. In addition to the web or instead of the web, in an advantageous embodiment the second housing shell is provided on the housing outer side with a channel which is set back with respect to the surrounding surface of the second housing shell. Here, this channel—just like the above-described web—extends around the edge of the second base plate and has, at at least one point, a drain leading to the edge of the second base plate, here in particular in the form of an opening of the peripheral channel to the edge of the second base plate. Here, the channel has the same effect as the above-described web in that it prevents liquid from flowing off in an uncontrolled manner over the edge of the second base plate and, rather, guides such liquid in a targeted manner to the or each drain.

Here, the or each drain of the web which extends around the second base plate or of the channel which extends around the second base plate is preferably used in synergistic interaction with an assigned outflow opening in the groove face of the first side wall. Here, the or each drain is arranged on the edge of the second base plate in such a way that it is aligned with the assigned outflow opening in the direction of the intended liquid channeling (in particular transversely to the second base plate). Here, although the liquid which flows off from the second base plate via the drain penetrates at least partly into the wall inter space of the first side wall, it is drained again to the outside there over a short distance through the assigned outflow opening.

In order to further improve the liquid channeling, the second side wall is provided with an outflow channel in a region which adjoins the or each drain of the web which extends around the second base plate or of the channel which extends around the second base plate. This outflow channel is preferably formed by two at least approximately parallel webs which are elevated with respect to the surrounding surface of the second side wall. Within the scope of the invention, the or each outflow channel can alternatively or additionally also be formed by the one channel which is set back with respect to the surrounding surface of the second side wall. Here, the outflow channel is in particular arranged on the second side wall in such a way that, starting from the assigned drain, it is oriented towards the optionally assigned outflow opening in the groove base of the wall inter space.

In a further embodiment of the invention, the means provided to channel liquid is a peripheral, raised (that is to say projecting in the direction of a partial wall of the first side wall) sealing edge which is arranged on the second side wall in a region in which this side wall—in the assembled state of the housing shells—engages in the wall interspace. Here, the sealing edge is in particular integrally formed on the outer side of the second side wall or mounted in some other way, and thus faces the outer partial wall of the first side wall. It is however also conceivable within the scope of the invention that the sealing edge or a further sealing edge is mounted on the inner side of the second side wall. Furthermore, within the scope of the invention, the sealing edge can also be arranged with the same effect on one of the partial walls of the first side wall, with the result that the sealing edge projects in the direction of the second side wall. Here, the or each sealing edge has the effect that it seals the wall inter space, to be more precise the slot formed between the second side wall and the opposite partial wall of the first side wall.

If the groove base between the partial walls of the first side wall is opened by one or more outflow openings, in an advantageous configuration of the invention the sealing edge is also interrupted in the region of the or each outflow opening for the purpose of improved liquid channeling.

In an expedient embodiment of the invention, at least one plug opening or plug recess for receiving an electrical connection plug is provided in at least one of the two housing shells. To prevent liquid from flowing into the plug opening or plug recess, the or each plug opening or plug recess is here preferably surrounded by a peripheral web which—again in the manner of a parapet—channels liquid around the plug opening or plug recess.

The first housing shell is preferably configured for holding the electronics. Here,—independently of the orientation of the electronics housing in the surrounding space—the first housing shell is also designated as a bottom shell, whereas the second housing shell is in this case also designated as a cover shell. In principle, however, it is also conceivable within the scope of the invention that the electronics is fastened to the second housing shell. In each case, the housing shells are preferably configured to hold a printed circuit board of the electronics in a plane which, in the assembled state of the two housing parts, intersects both partial walls of the first side wall and the second side wall. In other words, the printed circuit board is held by the housing shells in such a way that it is surrounded by the overlapping region of the first and second side wall. As a result, it is recognized that a particularly effective ESD protection is achieved.

The two housing shells are preferably held on one another in a form-fitting manner, in particular by a latching connection (clip connection). For this purpose, a first connecting element for the form-fitting connection of the two housing shells is arranged within the wall interspace or on a wall surface of the first side wall that faces the wall interspace, whereas a corresponding second connecting element is arranged on a portion of the second side wall that engages as intended in the wall inter space. In this way, the two interacting connecting elements, and thus also the form-fitting connection of the housing shells, are received between the partial walls of the double-walled first side wall in the assembled state of the housing shells and thereby protected from damage or improper opening.

Here, in an advantageous embodiment, the connecting elements are in particular arranged on the respective housing shell in such a way that they do not project beyond the edges of the side wall there. By virtue of this geometric specification, the housing shells have a particularly robust design and therefore allow particularly simple mounting or logistics. For example, the housing shells can consequently be transported and stored as bulk goods without having to fear breakage of connecting elements.

In an expedient embodiment, the connecting element assigned to the first housing shell is formed by a latching nose, and the connecting element assigned to the second housing shell is formed by a cutout (eye) which corresponds with the latching hook as an abutment, with the result that the two housing shells can be clipped together. Here, in a preferred arrangement, the latching nose is spring-mounted on the doubled first side wall, in particular on the wall surface of the inner partial wall that faces the housing interior.

In order nevertheless to be able to release the form-fitting connection between the housing shells in spite of the connecting elements protected by the first side wall, the connecting elements are preferably mounted on the respective housing shell in such a way that, in the assembled state of the housing shells, they are accessible through the outflow opening or one of the outflow openings to release the connection of the housing shells. Although the connecting elements are thus largely divested of unauthorized access, they nevertheless allow destruction-free opening of the housing—in particular using a special tool.

The electronics housing is preferably used as a constituent part of a control device of the motor vehicle, in particular as a tailgate control device, and in this case contains the electronics of the control device.

Other features which are considered as characteristic for the invention are set forth in the appended claims.

Although the invention is illustrated and described herein as embodied in a electronics housing for electronics in a motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Parts and variables which correspond to one another are always provided with identical reference signs in all the figures.

Figure 1:
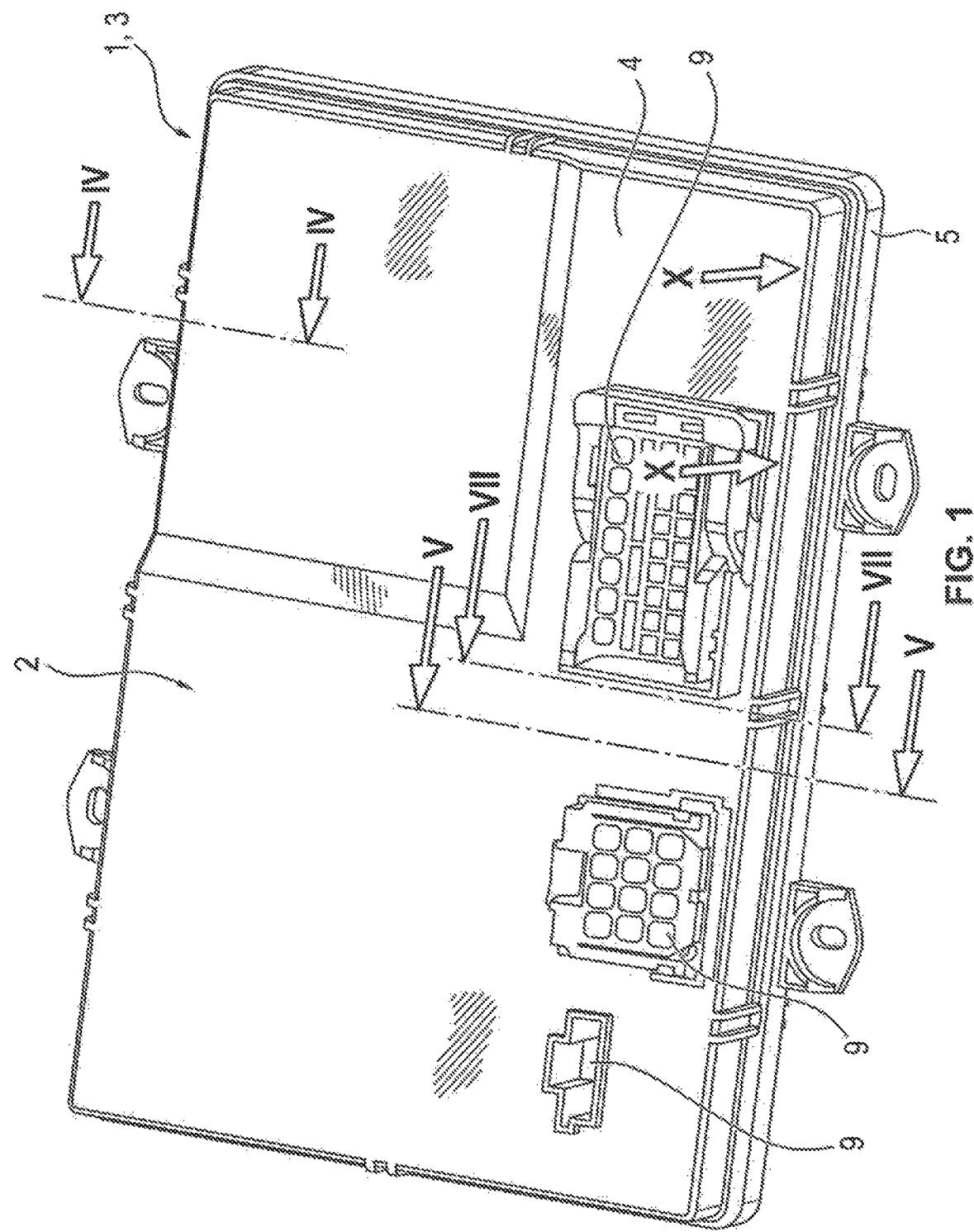
FIG. 1 is a diagrammatic, perspective view of an electronics housing of a tailgate control device for a motor vehicle, which housing is composed of a bottom shell and a cover shell.

Referring now to the figures of the drawings in detail and first, particularly to FIG. 1 thereof, there is shown an (electronics) housing 1 which is intended for receiving electronics used in a motor vehicle, with a view of a housing side designated herein below as an upper side 2. Position-defining terms such as "upper" or "lower" refer to the orientation of the housing 1 that is illustrated in FIG. 1 and are used herein below independently of the actual orientation of the housing 1 in the surrounding space. The intended mounting position of the housing 1 on or in the motor vehicle can differ from the orientation indicated by this the choice of terminology. In particular, the electronics housing can also be mounted "upside down" (i.e. with the upper side 2 to the bottom), on edge or obliquely in the motor vehicle.

The housing 1 is for example a constituent part of a tailgate control device 3 of the motor vehicle.

Figure 11:
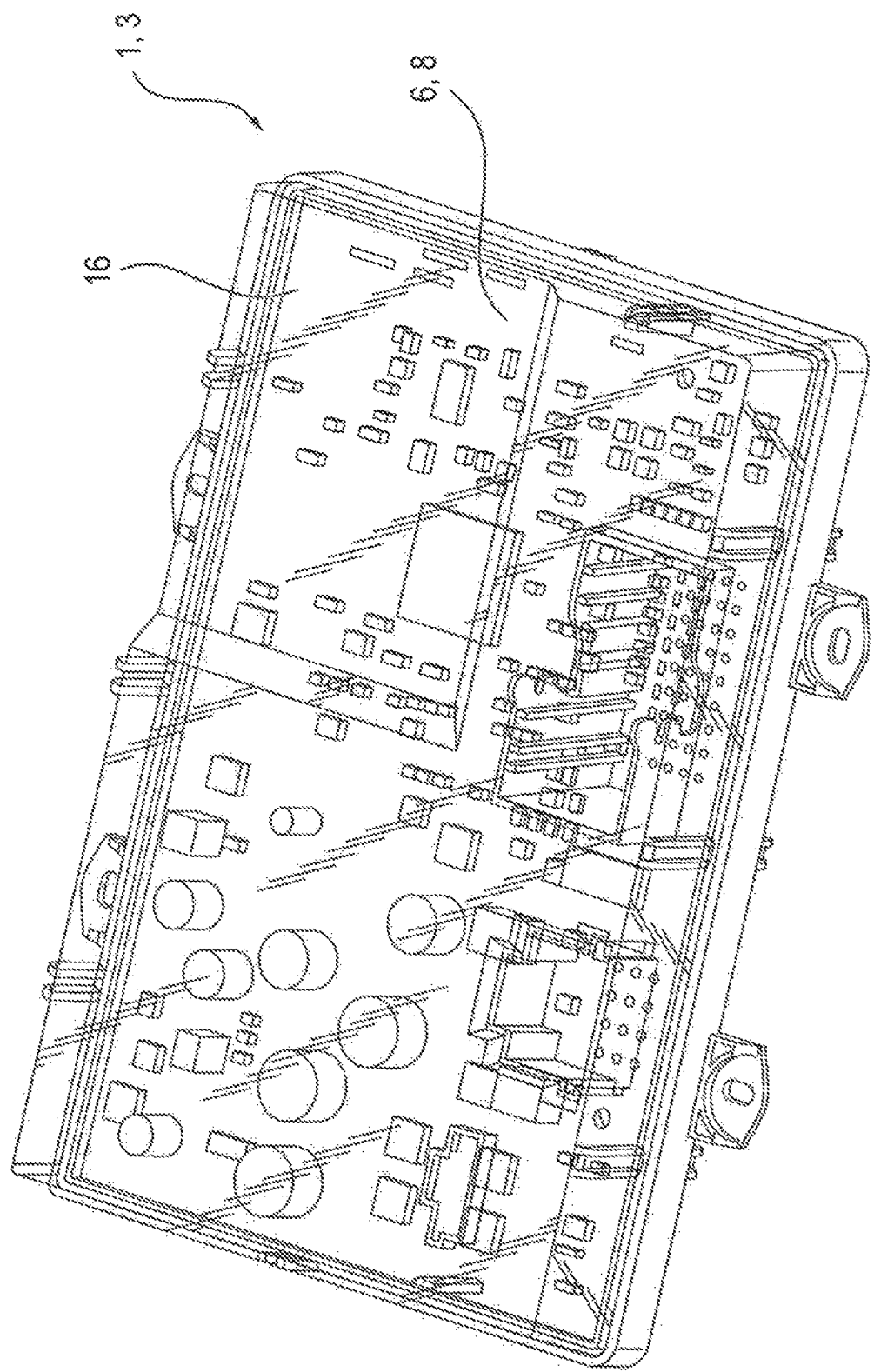
FIG. 11 is a perspective view according to FIG. 9 of the electronics housing according to FIG. 1 with a transparently illustrated cover shell to make it possible to see electronics received in the housing.

The housing 1 contains a housing shell (designated as cover shell 4) and a housing shell (designated as bottom shell 5), wherein the two housing shells are assembled to form the substantially closed housing 1. The housing 1—considered in simplified form—is of flat parallelepipedal design and serves for receiving electronics 8 (FIG. 11) containing a printed circuit board 6 (FIG. 11). The areal extent of the housing 1 corresponds approximately to the areal extent of the printed circuit board 6. The housing 1 is produced, for example, from fiber-reinforced plastic of the type PBT (polybutylene terephthalate) or PA (polyamide) with a glass fiber fraction of approximately 15% to 30%.

The electronics 8 contains a microcontroller on which a software is installed in an executable manner for controlling a tailgate drive of the vehicle. On the upper side 2 of the housing 1 there are arranged three plug connections 9 (aggregate connections) which serve for connecting control lines or energy supply lines to the electronics 8 in the housing interior.

Figure 2:
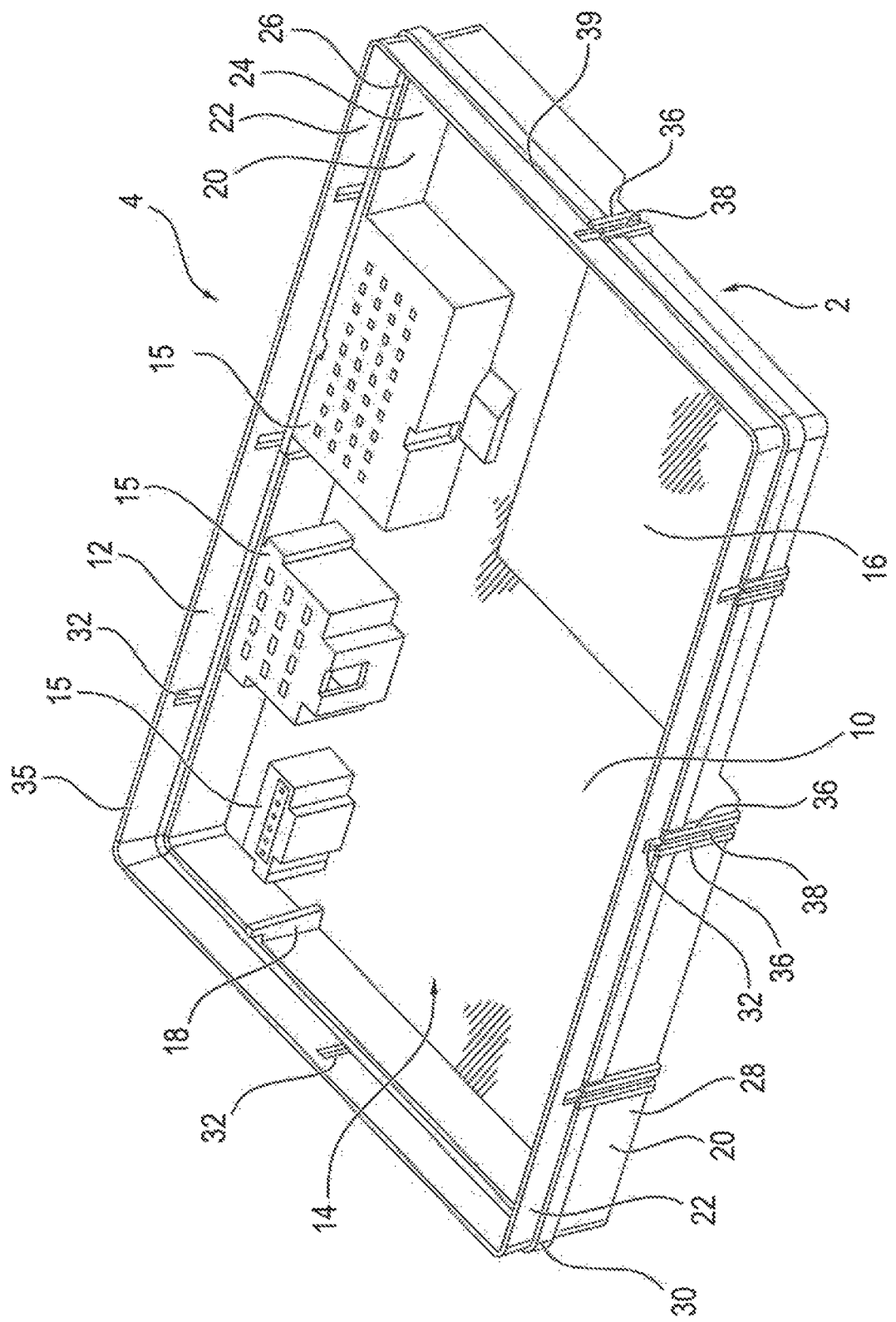
FIG. 2 is a perspective view of the cover shell with a view into an interior enclosed by the cover shell.

As can be seen from FIG. 2, the cover shell 4 is formed as an approximately flat parallelepipedal molded part which is open to one side. The cover shell 4 contains a base plate (designated herein below as cover plate 10) which is rectangular in outline and the corners of which are rounded off. The cover plate 10 is enclosed all around by a side wall 12 which projects approximately orthogonally from the cover plate 10. The cover shell 4 encloses an interior 14.

Three receptacles 15 for the plug connections 9 are formed out of the cover plate 10. Each receptacle projects into the interior 14 as a trough-like depression (plug recess) which is open to the upper side 2. Each of the receptacles 15 is provided with a plurality of openings for guiding through contact pins.

In a region 16, the cover plate 10 is set back into the interior 14 in a step with partial reduction of the housing height.

A centering structure 18 projects from the side wall 12 on the inner side at one point and serves for the positioning and positional fixing of the printed circuit board 6 received as intended in the housing 1.

The side wall 12 is essentially subdivided into a cover plate-side first portion 20 and an edge-side second portion 22, wherein the second portion 22 is outwardly offset with respect to the first portion 20 in a step. As a result, on the one hand, a peripheral stop 26 is formed on a (wall) inner side 24 which faces the interior 14. On the other hand, a beveled step 30 is formed on a (wall) outer side 28 which is situated oppositely to the inner side 24.

The side wall 12 is breached in the region of the second portion 22 by a plurality of openings 32 which each serve as a connecting element for the form-fitting connection of the cover shell 4 to the bottom shell 5. Each opening 32 is arranged at a spacing from an outer edge 35 of the side wall 12, the individual openings 32 being uniformly distributed over the length or width of the cover shell 4. Each opening 32 here has a slot-like, approximately rectangular contour.

Adjoining each of the openings 32, webs 36 are integrally formed on the outer side 28 of the side wall 12 largely in the region of the first portion 20, the webs protruding with respect to the surrounding housing surface. Starting from the opening 32, each web 36 extends transversely to the longitudinal extent of the side wall 12 in the direction of the upper side 2 of the housing 1. Here, in each case two webs 36 extend with a parallel offset to one another with the formation of a narrow (outflow) channel 38, with each of the channels 38 being aligned with one of the openings 32. A web or projection as sealing edge 39 extends all around the cover shell 4 parallel to the outer edge 35 in the portion 22. The sealing edge 39 is interrupted in each case in the region of the channels 38 and in each case terminates there in abutment with an end of the webs 36.

Figure 3:
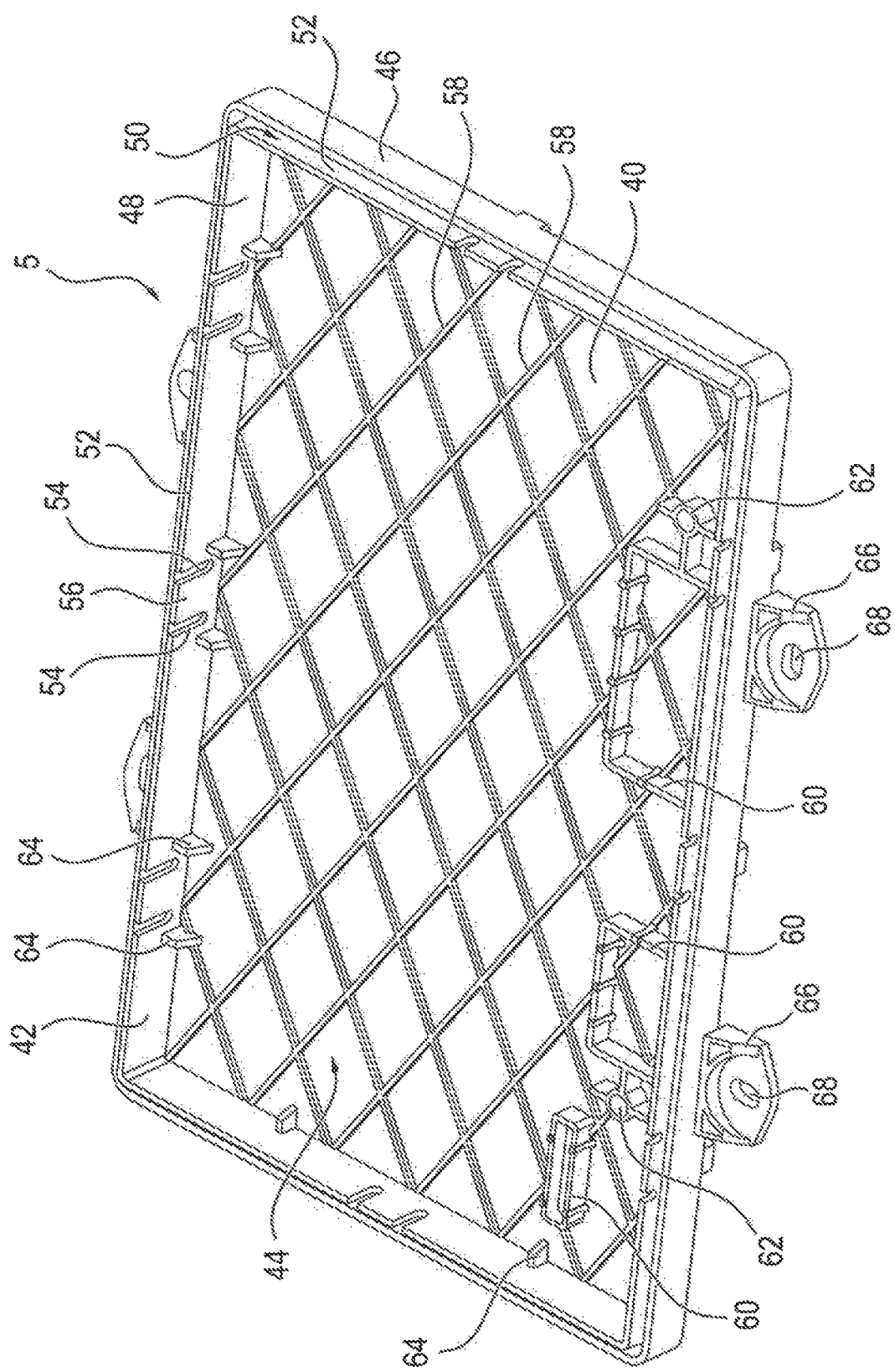
FIG. 3 is a perspective view of the bottom shell with a view into an interior enclosed by the bottom shell.

The bottom shell 5 shown in FIG. 3 contains a base plate (bottom plate 40 hereinbelow) which is formed congruently to the cover plate 10, namely likewise being rectangular in outline with rounded-off corners. However, the entire bottom plate 40 lies in a uniform plane. The bottom plate 40 is enclosed by a peripheral, approximately orthogonally projecting side wall 42, with the result that the bottom shell 40 delimits an interior 44. By contrast with the cover shell 4, the side wall 42 is designed to be double-walled over virtually its entire height in the bottom shell 5. The side wall 42 thus consists of a first partial wall which is arranged on the housing outer side, and is therefore designated as outer wall 46, and of a second partial wall which is arranged on the housing inner side, and is therefore designated as inner wall 48. The inner wall 48 and the outer wall 46 extend so as to be offset to one another in an at least approximately plane-parallel manner by a small distance, with the result that a narrow (wall) interspace 50 which is approximately equally wide at each point is formed between the inner wall 48 and the outer wall 46. The interspace 50 is open in the manner of a groove to an outer edge 52 of the side wall 42 and delimited to the housing bottom by the bottom plate 40.

Slot pairs 54 are formed at a plurality of points into the inner wall 48 starting from the outer edge 52, with the result that each slot pair 54 formed by two parallel slots cuts free a narrow (spring) portion 56 of the inner wall 48 from the surrounding wall. Each of these portions 58 is capable of springing transversely to the areal extent of the inner wall 48. Each portion 56 is part of a connecting element which corresponds with one of the openings 32 in the cover shell 4 (FIG. 2). The design of the connecting elements will be discussed in more detail later with reference to FIG. 7.

The bottom plate 40 is provided on its inner side with a plurality of reinforcing ribs 58. In addition, bearing webs 60 project out of the bottom plate 40 and in their contour reproduce the recesses 15 for the plug connections 9 (FIG. 2). Moreover, in the vicinity of the bearing webs 60, screw domes 62 are formed out of the bottom plate 40 and serve for screwing the printed circuit board 6 in the bottom shell 5 (see also FIG. 12).

Bearing points 64 are formed out of the side wall 42 and the bottom plate 4 at a plurality of points and interact with the bearing webs 60 to form a bearing surface for the printed circuit board 6 and at the same time stiffen the bottom shell 5.

On the outer side of the bottom shell 5, in each case two lugs 66 project on both longitudinal sides and lie in one plane with the bottom plate 40. Each lug 66 is provided with a hole 68 which serves for screwing the housing 1 to a vehicle part. However, the housing 1 can also be fastened on a carrier or the like, which is then for its part fastened to a vehicle part.

Figure 4:
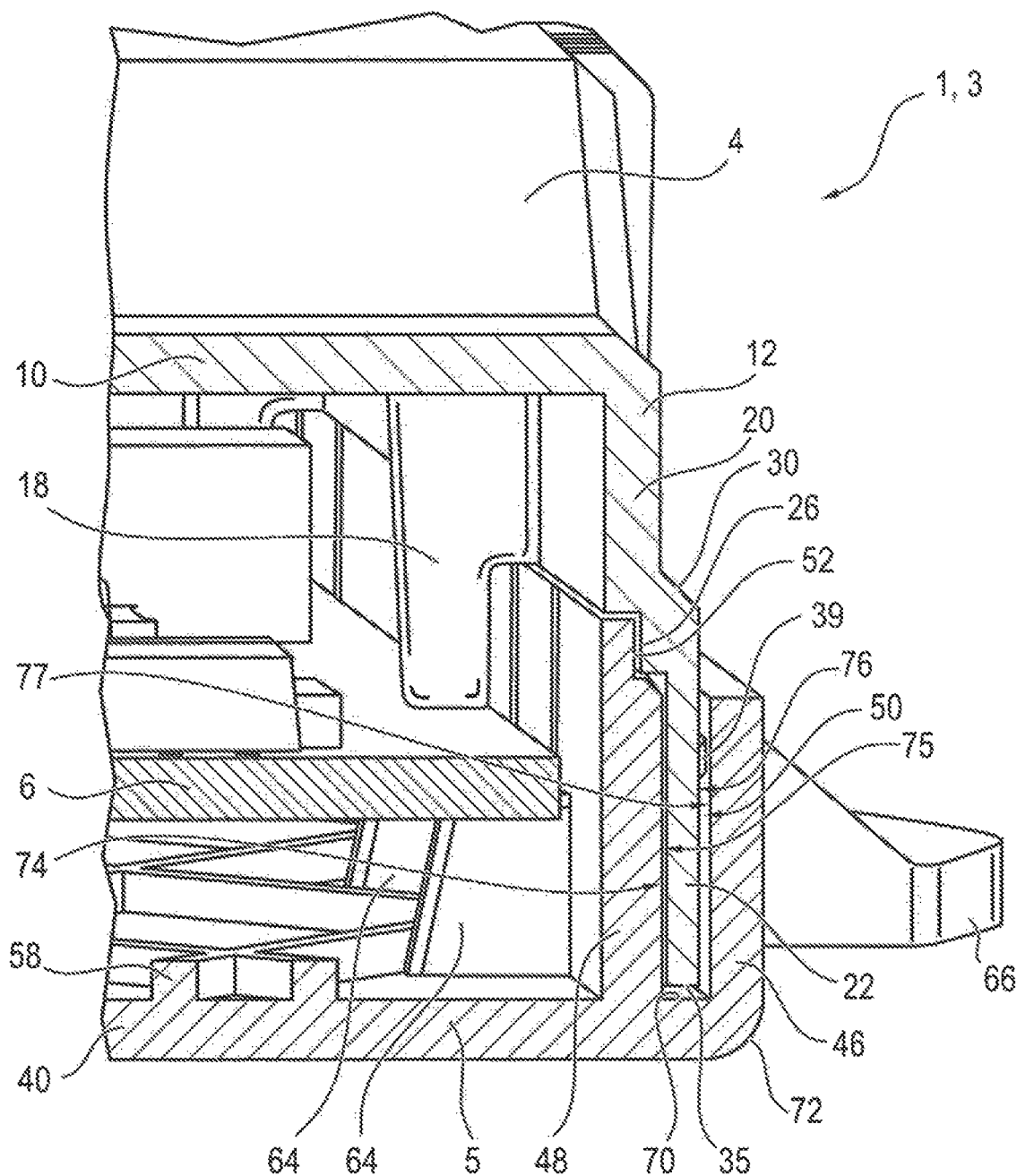
FIG. 4 is a sectional and perspective view of a detail of the electronics housing taken along the line IV-IV shown in FIG. 1.

As can be seen from the section according to FIG. 4, in the assembled state, the cover shell 4 projects by way of the portion 22 of the side wall 12 into the inter space 50 formed between the inner wall 48 and the outer wall 46 of the bottom shell 5.

Moreover, it can be seen from the illustration that the stop 26 of the cover shell 4 is configured in a step which, in the manner of a rebate, is configured in a complementary manner to a corresponding step on an outer edge 52 of the inner wall 48. The inner wall 48 is aligned with the portion 20 of the side wall 12, whereas the portion 22 engages in the inter space 50 by virtue of its outwardly directed offset. Here, the portion 22 corresponds in its height approximately to the height of the side wall 42 of the bottom shell 5. The portion 22 accordingly extends in the inter space 50 approximately to the bottom, designated herein below as groove base 70, of the inter space 50.

A lower edge 72 of the bottom shell 5 that is formed between the outer wall 46 and bottom plate 40 is peripherally rounded off by a radius.

The wall thickness of the side wall 12 in the region of the portion 22 is reduced by comparison with the wall thickness in the portion 20. Here, the wall thickness of the portion 22 is dimensioned to be somewhat smaller than the width of the inter space 50, with the result that the portion 22 is received with a certain play transversely to the longitudinal extent of the inter space 50. Here, the portion 22 has its inner side 74 bearing in a planar and accurately fitting manner on the outer side 75 of the inner wall 48.

The sealing edge 39 serves for sealing a gap formed between an outer side 76 of the portion 22 and an inner side 77 of the outer wall 46. The sealing edge 39 can—as illustrated here—be formed out of the material of the housing shell as a peripheral projection. However, it is also conceivable for the sealing edge 39 to be produced as a sealing lip consisting of an elastic material.

As is also clear from FIG. 4, the printed circuit board 6 lies within the housing 1 within a plane which intersects the surrounding housing wall in that region in which the double-walled side wall 12 (with the outer wall 46 and the inner wall 48) and the side wall 42 overlap. The wall thickness of the housing 1 that is approximately triple in this overlapping region means that the risk of an electrostatic discharge is safely prevented.

In addition, the inter-engagement of the side walls 12 and 42 achieves improved dripping water tightness, as is illustrated with reference to FIGS. 5 to 7.

Figure 5:
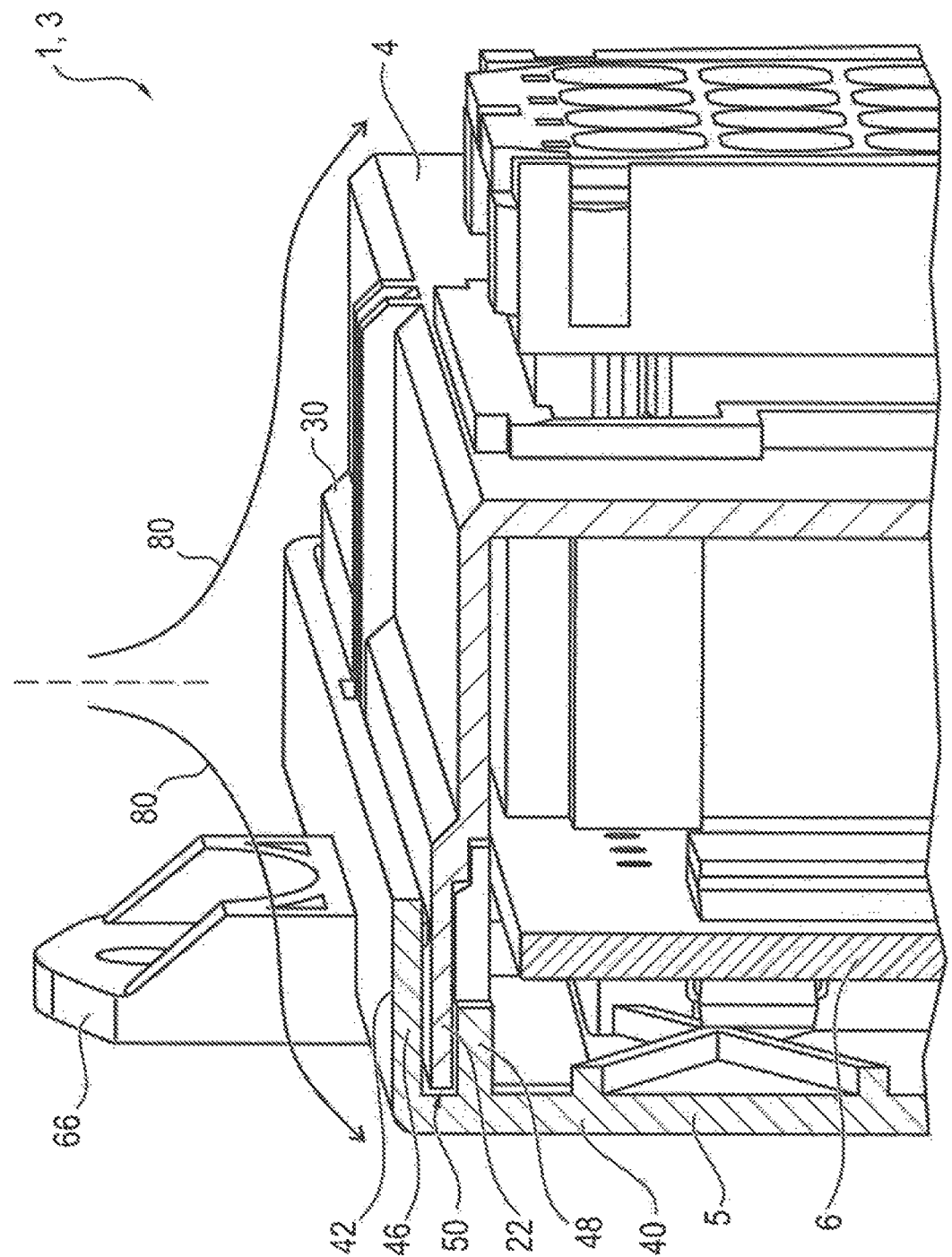
FIG. 5 is a sectional and perspective view of the electronics housing taken along the line V-V shown in FIG. 1.

FIG. 5 here shows first a lateral installation position of the housing 1 in which the areal extent of the housing 1 is oriented approximately vertically. Arrows are used here to indicate the gravity-induced water runoff on the housing 1 in the case of an impingement by dripping water. Here, a main runoff direction 80 of the dripping water impinging on the housing 1 is obtained by the step-like profile of the housing surface—in particular by the step 30 —, the main runoff direction being directed away at each point from the separation of the two housing shells. A situation is thereby prevented in which water accumulates in the inter space 50. Here, the labyrinth-like connection of the two housing shells and the sealing edge 39 effectively prevent water which nevertheless penetrates into the interspace 50 from passing into the interior of the housing 1.

Figure 6:
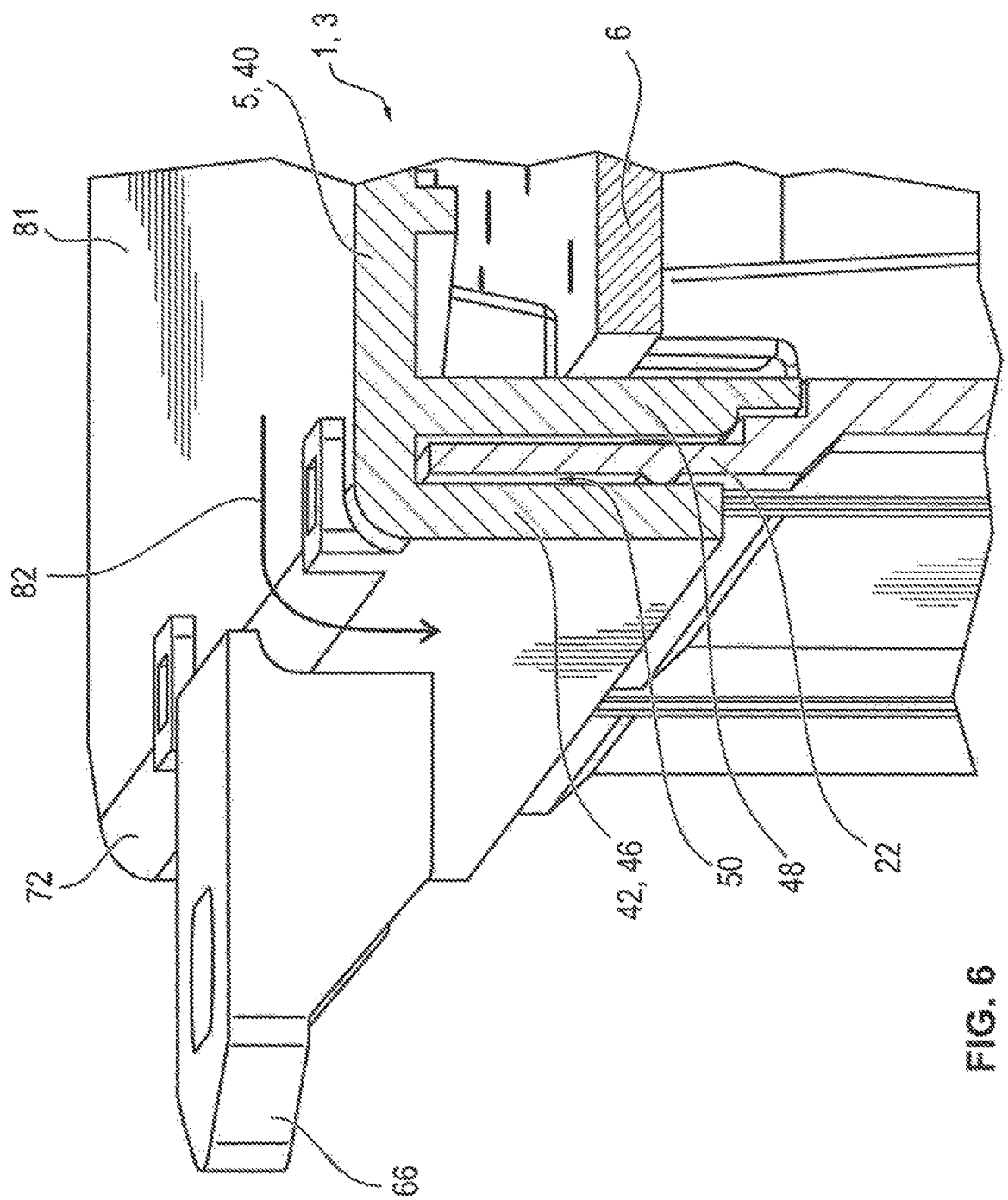
FIG. 6 is a sectional and perspective view taken along the line IV-IV from FIG. 1 which has been rotated by comparison with FIG. 4.

FIG. 6 shows an "upside down" installation position of the housing 1 in which the areal extent of the housing 1 is oriented approximately horizontally, with the result that an underside 81 of the housing 1 points upward. A main runoff direction 82 provided in this installation position in the case of a water impingement on the underside 81 of the housing 1 is again indicated by an arrow. It can be seen from this illustration that the radius formed on the lower edge 72 assists the water outflow from the bottom plate 40.

Figure 7:
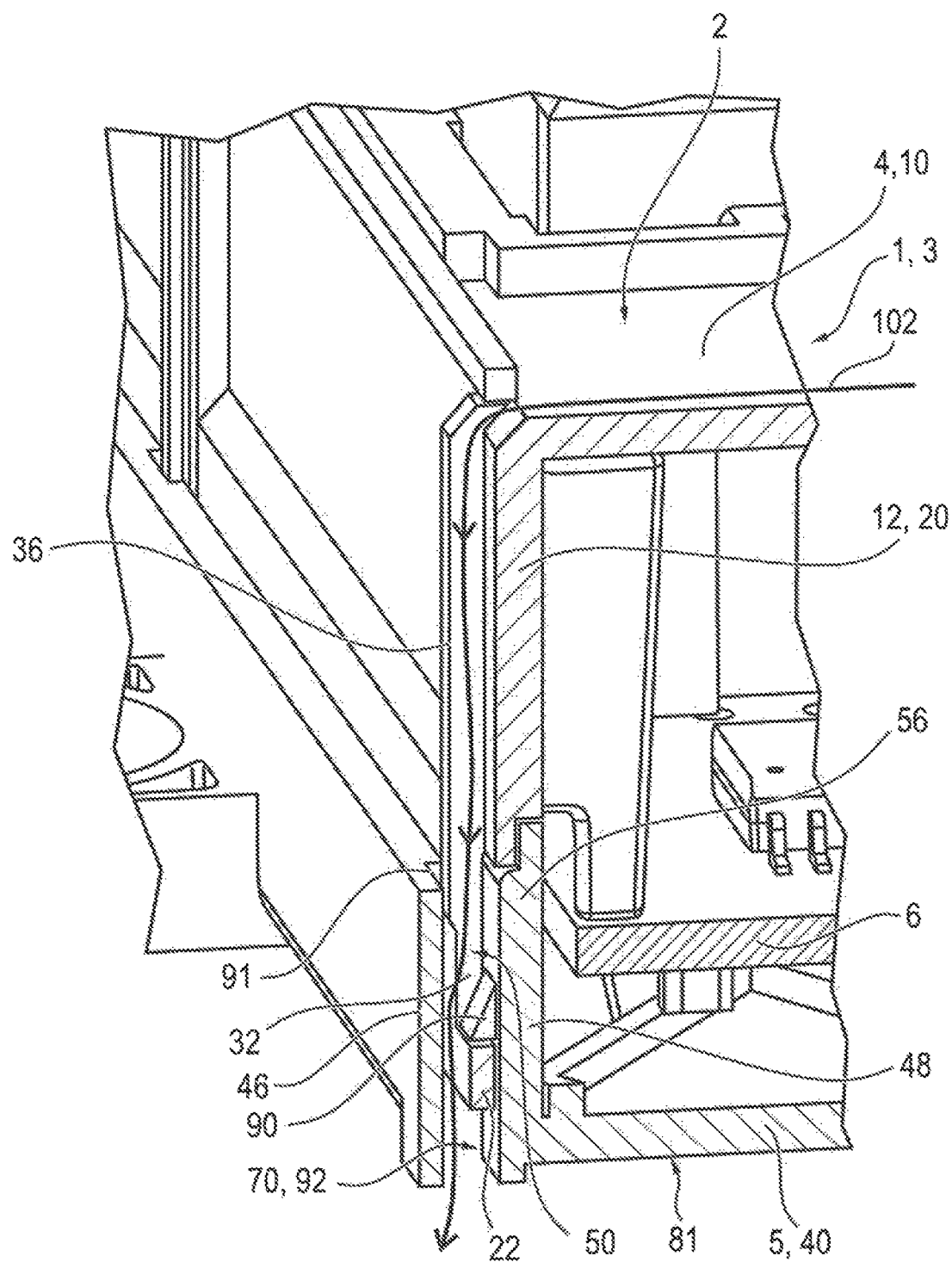
FIG. 7 is a sectional and perspective view of the electronics housing taken along the line VII-VII shown in FIG. 1.

The section according to FIG. 7 illustrates on the one hand the interaction of the aforementioned connecting elements for the form-fitting connection of the two housing shells. Accordingly, a latching nose 90 which projects outwardly—and thus protrudes into the inter space 50—is integrally formed on the spring portion 56 of the bottom shell 5. With the housing 1 assembled, this latching nose 90 engages in the assigned opening 32 with the formation of a form-fitting connection.

Figure 10:
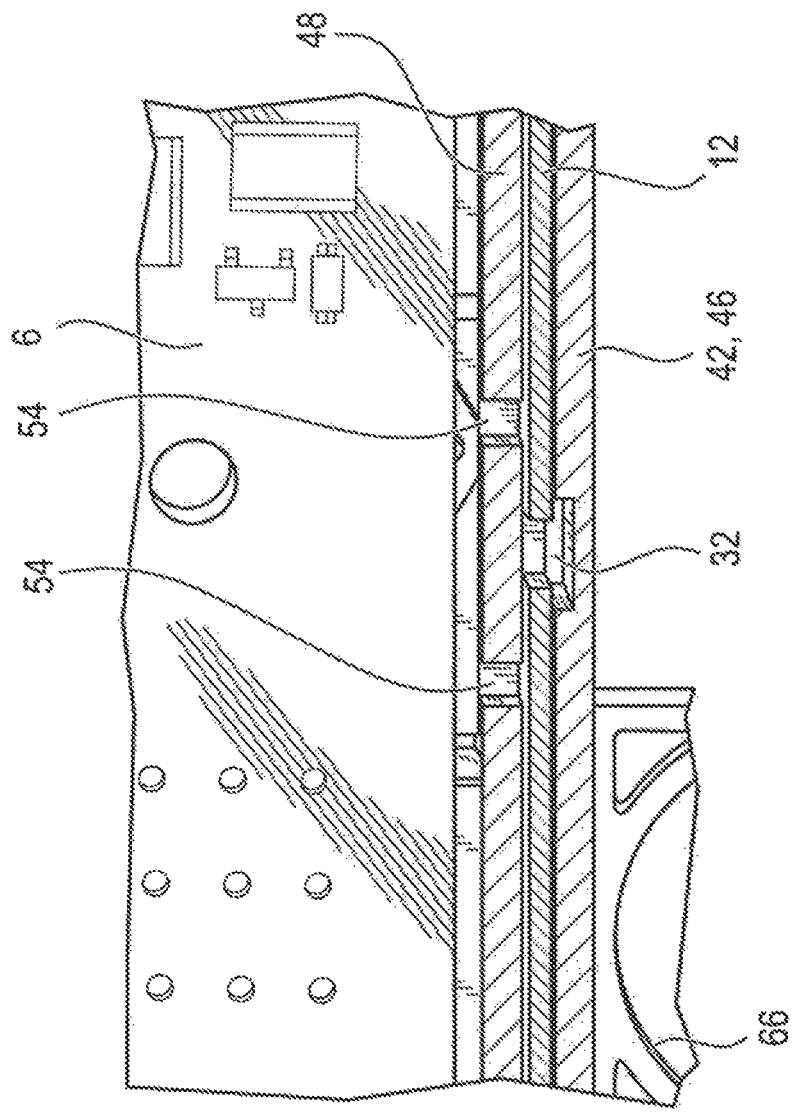
FIG. 10 is a sectional view of a detail of the electronics housing in a section parallel to the drawing plane of FIG. 1.

On the other hand, FIG. 7 illustrates the dripping water channeling if the housing 1 is mounted in the orientation represented in FIG. 1, namely with upwardly directed upper side 2. Each of the webs 36 integrally formed on the side wall 12 projects up to the height of the peripheral sealing edge 78 (which is, however, interrupted in the region between the webs 36) into the interspace 50. In this region, a groove 91 which engages around the webs 36 extends on the inner side 77 of the outer wall 46 over the entire height of the outer wall 46. A passage—which is visible in FIG. 10 in cross section—is thus formed between the webs 36 in the interspace 50, via which passage the dripping water channeled in the channel 38 between the webs 36 can run into the interspace 50.

In order that the interspace 50 is nevertheless not filled by the dripping water which runs in, a lead through 92 to each channel 38 is incorporated in the groove base 70 and is opened to the underside 81 of the housing 1. By virtue of this lead through 92 acting as an outflow opening, the dripping water penetrating into the interspace 50 is channeled out again from the interspace 50.

Furthermore, it is also possible for the latching noses 90 to be released by means of a tool from the corresponding openings 32 through these leadthroughs 92 in order to nondestructively release the form-fitting connection of the housing shells as required.

Figure 8:
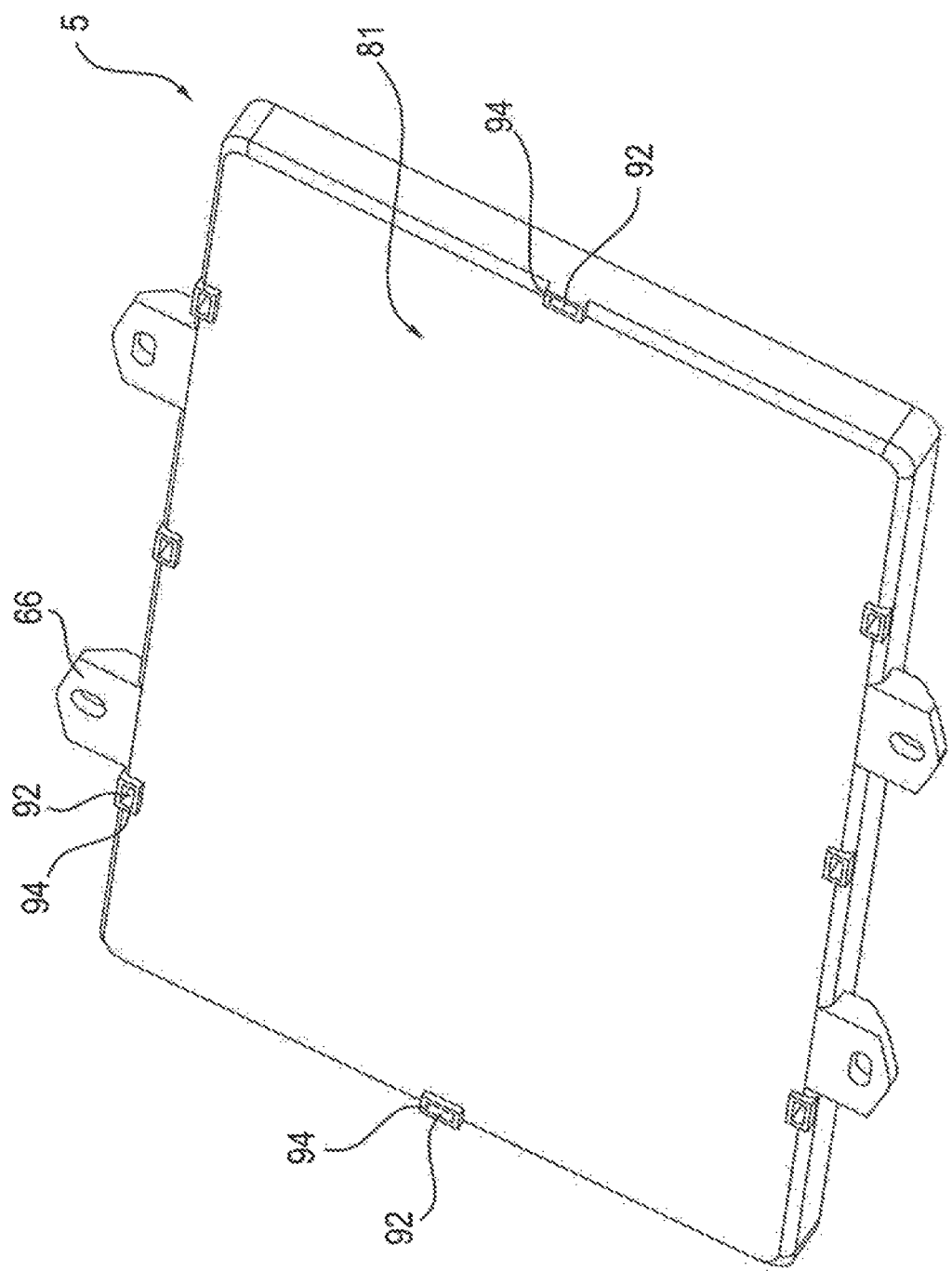
FIG. 8 is a perspective view of the bottom shell with a view of its outer side.

According to FIGS. 6 and 8, the leadthroughs 92 are protected at their outlet on the underside 81 of the housing 1 against penetrating water by means of a respective peripheral web 94 if the housing 1 is mounted in the upside down position (FIG. 6).

Figure 9:
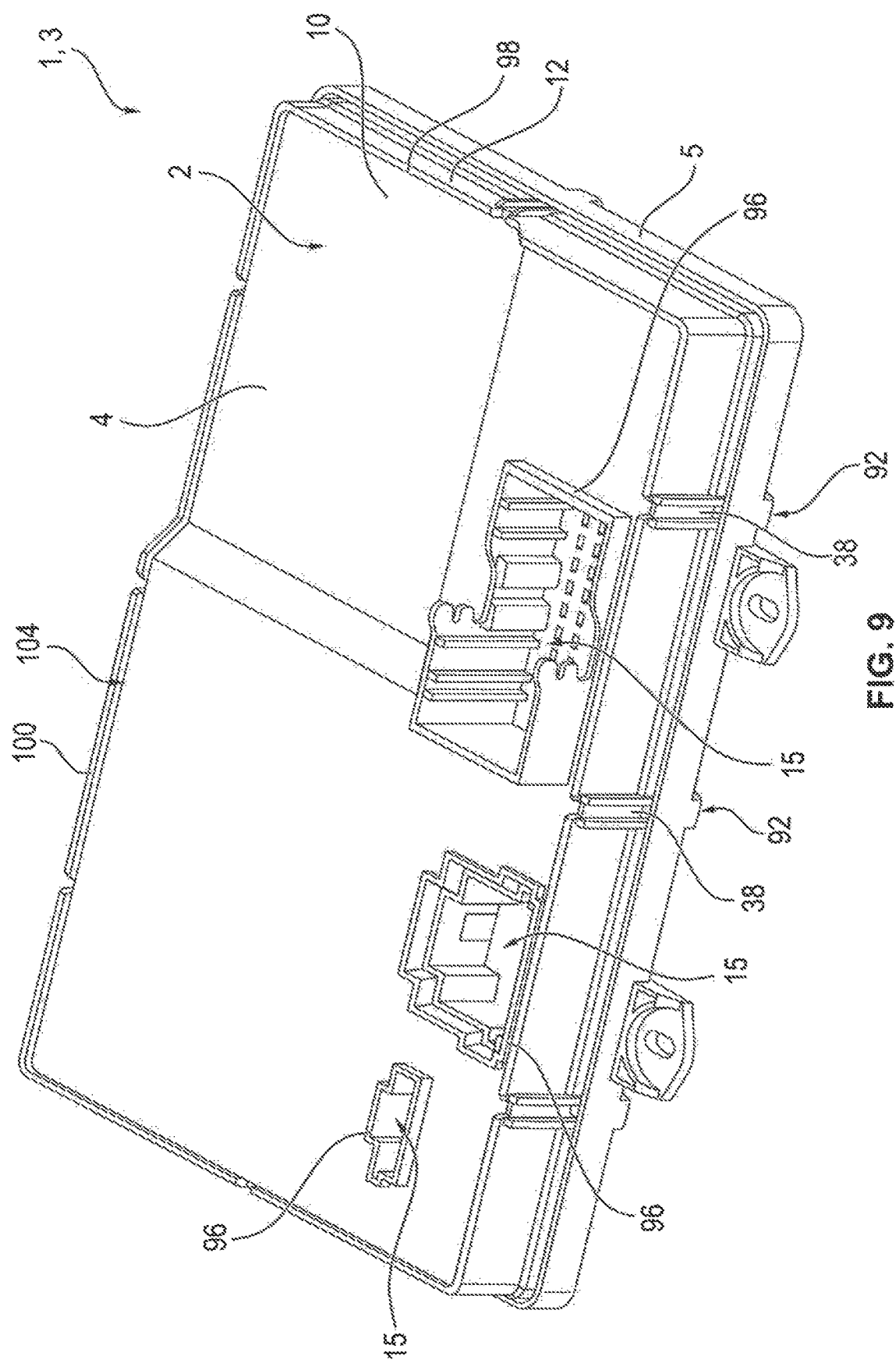
FIG. 9 is a perspective view of the electronics housing of the cover shell.

FIG. 9 shows that the receptacles 15 (shown here without inserted plug connections 9) are also each enclosed by a peripheral web 96 which prevents an inflow of dripping water into the receptacles 15. Moreover, the cover plate 10 is peripherally enclosed, at an upper edge 98 which connects the cover plate 10 and the side wall 12, by a web 100 which is elevated with respect to the surrounding surface. In the region of the lateral channels 38, the web 100 has a respective interruption 101 (or gap). The interruption 101 achieves a targeted drainage of liquid which has possibly accumulated on the cover plate 10. Such liquid is channeled by the web 100 to the interruptions 101 incorporated therein and flows from there via the channels 38 and the adjoining leadthroughs 92. A corresponding runoff direction 102 is indicated by an arrow in FIG. 7. Optionally, a circumferential groove or channel 104 is additionally incorporated in the cover plate 10 along the web 100.

Figure 12:
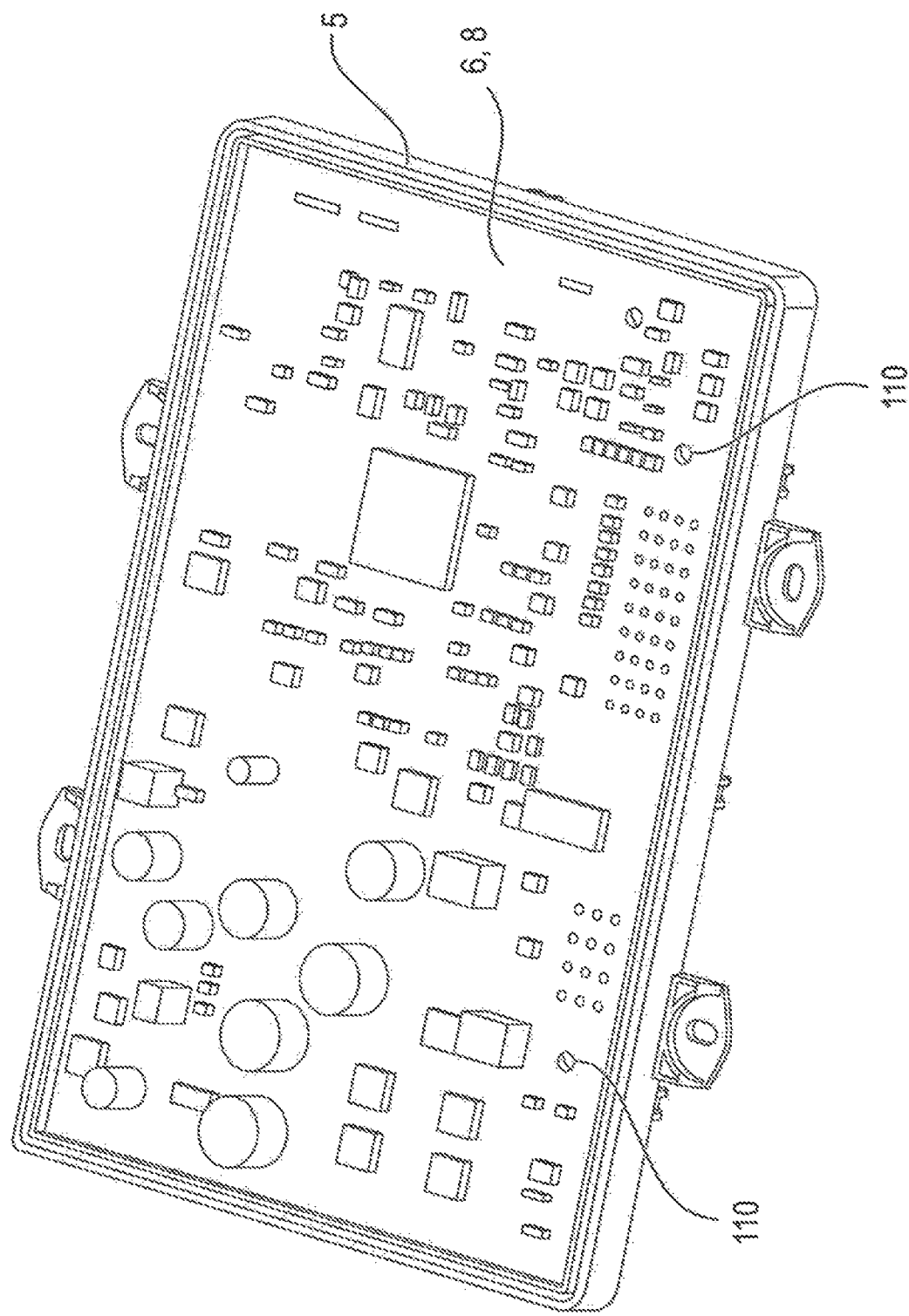
FIG. 12 is a perspective view according to FIG. 9 of the bottom shell of the electronics housing with electronics mounted therein.

FIG. 11 and FIG. 12 show the housing 1 or the bottom shell 5 in each case with inserted electronics 8. It can be seen from FIG. 11 that the height of the housing 1 in the region 16 is adapted with installation space optimization to the predetermined arrangement of the printed circuit board 6 populated with electronic components. FIG. 12 shows that the printed circuit board 6 is screwed in the bottom shell 5 by means of screws 110.

The subject matter of the invention is not limited to the above-described exemplary embodiment. Rather, further embodiments of the invention can be derived from the above description by a person skilled in the art.

The following is a summary list of reference numerals and the corresponding structure used in the above description of the invention:

1 (Electronics) housing
2 Upper side
3 Tailgate control device
4 Cover shell
5 Bottom shell
6 Printed circuit board
8 Electronics
9 Plug connection
10 Cover plate
12 Side wall
14 Interior
15 Receptacle
16 Region
18 Centering structure
20 Portion
22 Portion
24 (Wall) inner side
26 Stop
28 (Wall) outer side
30 Step
32 Opening
35 Outer edge
36 Web
38 (Outflow) channel
39 Sealing edge
40 Bottom plate
42 Side wall
44 Interior
46 Outer wall
48 Inner wall
50 (Wall) interspace
52 Outer edge
54 Slot pair
56 (Spring) portion
58 Reinforcing rib
60 Bearing web
62 Screw dome
64 Bearing point
66 Lug
68 Hole
70 Groove base
72 Lower edge
74 Inner side
75 Outer side
76 Outer side
77 Inner side
80 Main runoff direction
81 Underside
82 Main runoff direction
90 Latching nose
91 Groove
92 Leadthrough
94 Web
96 Web
98 Upper edge
100 Web
101 Interruption
102 Runoff direction
104 Channel
110 Screw

The invention claimed is:

1. An electronics housing for electronics in a motor vehicle, comprising:
   a first housing shell having a first base-plate and a peripheral first side wall projecting from said first base-plate;
   a second housing shell having a second base-plate and a peripheral second side wall projecting from said second base-plate;
   said first and second housing shells being connected to each other in an assembled state;
   said first side wall being double-walled completely or at least in one portion and having an outer partial wall and an inner partial wall, with a result that a groove-shaped wall interspace is formed between said outer partial wall and said inner partial wall of said first side wall, and in the assembled state of the electronics housing, said second side wall engaging in said grooved-shaped wall interspace;
   said first side wall further having a groove base with at least one outflow opening formed therein, by means of said groove base said inner and outer partial walls of said first side wall are connected, said outflow opening leading to an outer side of the electronics housing in order to allow a liquid outflow from said groove-shaped wall interspace; and
   said first housing shell having a peripheral web, said outflow opening being surrounded on said outer side by said peripheral web, with a result that said outflow opening is elevated with respect to a surrounding surface of said first housing shell.

2. The electronics housing according to claim 1, wherein said first side wall has a height and is double-walled over a predominant fraction of said height.

3. An electronics housing for electronics in a motor vehicle, comprising:
   a first housing shell having a first base-plate and a peripheral first side wall projecting from said first base-plate;
   a second housing shell having a second base-plate and a peripheral second side wall projecting from said second base-plate;
   said first and second housing shells being connected to each other in an assembled state;
   said first side wall being double-walled completely or at least in one portion and having an outer partial wall and an inner partial wall, with a result that a groove-shaped wall interspace is formed between said outer partial wall and said inner partial wall of said first side wall, and in the assembled state of the electronics housing, said second side wall engaging in said grooved-shaped wall interspace;
   said second housing shell having on a housing outer side at least one of a web which is elevated with respect to a surrounding surface of said second housing shell and a channel which is set back with respect to said surrounding surface of said second housing shell; and
   said web and/or said channel extend around an edge of said second base-plate and have, at at least one point, a drain leading to said edge of said second base-plate in order to allow a defined liquid outflow from the second base-plate at said point.

4. The electronics housing according to claim 3, wherein said drain is aligned with said outflow opening.

5. The electronics housing according to claim 3, wherein said second side wall has an outflow channel in a region adjoining said drain in order to channel liquid exiting from said drain.

6. The electronics housing according to claim 3, further comprising a peripheral sealing edge for sealing said groove-shaped wall interspace and being integrally formed or mounted on said second side wall or one of said inner and outer partial walls of said first side wall, said sealing edge projecting in a direction of a respective other of said first and second side walls.

7. The electronics housing according to claim 6, wherein said sealing edge is interrupted in a region of said outflow opening in said groove base of said first side wall.

8. The electronics housing according to claim 3, wherein at least one of said first and second housing shells has a peripheral web and a plug opening or a plug recess formed therein for receiving a connection plug, and each said plug opening or said plug recess is surrounded by said peripheral web.

9. The electronics housing according to claim 3, wherein said first housing shell is configured to hold the electronics.

10. The electronics housing according to claim 3, wherein said first and second housing shells are configured to hold a printed circuit board of the electronics in a plane which, in the assembled state of said first and second housing shells, intercepts both said inner and outer partial walls of said first side wall and said second side wall.

11. The electronic control device according to claim 3, wherein said first side wall has a groove base with at least one oufflow opening formed therein, by means of said groove base said inner and outer partial walls of said first side wall are connected, said outflow opening leads to an outer side of the electronics housing in order to allow a liquid outflow from said groove-shaped wall interspace.

12. An electronics housing for electronics in a motor vehicle, comprising:
 a first housing shell having a first base-plate and a peripheral first side wall projecting from said first base-plate;
 a second housing shell having a second base-plate and a peripheral second side wall projecting from said second base-plate;
 said first and second housing shells being connected to each other in an assembled state;
 said first side wall being double-walled completely or at least in one portion and having an outer partial wall and an inner partial wall, with a result that a groove-shaped wall interspace is formed between said outer partial wall and said inner partial wall of said first side wall, and in the assembled state of the electronics housing, said second side wall engaging in said grooved-shaped wall interspace;
 a first connecting element for a form-fitting connection of said first and second housing shells, said first connecting element is disposed within said groove-shaped wall interspace or on a wall surface of said first side wall that faces said groove-shaped wall interspace; and
 a corresponding second connecting element disposed on a portion of said second side wall that engages as intended in said groove-shaped wall interspace, with a result that, in the assembled state of said first and second housing shells, said first and second connecting elements are received between said inner and outer partial walls of said first side wall.

13. The electronics housing according to claim 12, wherein said first and second connecting elements are disposed on a respective one of said first and second housing shells in such a way that said first and second connecting elements do not project beyond edges of a respectively assigned one of said first or second side walls of said first and second housing shells.

14. The electronics housing according to claim 12, wherein said first and second connecting elements are mounted on a respective one of said first and second housing shells in such a way that, in the assembled state of said first and second housing shells, said first and second connecting elements are accessible through said oufflow opening to release a connection of said first and second housing shells brought about by said first and second connecting elements.

15. The electronic control device according to claim 12, wherein said first side wall has a groove base with at least one outflow opening formed therein, by means of said groove base said inner and outer partial walls of said first side wall are connected, said outflow opening leads to an outer side of the electronics housing in order to allow a liquid outflow from said groove-shaped wall interspace.

16. An electronic control device for a motor vehicle, comprising:
 an electronics housing according to claim 3.

17. The electronic control device according to claim 16, wherein the electronic control device is a tailgate control device.

* * * * *